US009466755B2

(12) United States Patent
Cao et al.

(10) Patent No.: US 9,466,755 B2
(45) Date of Patent: Oct. 11, 2016

(54) MIS-IL SILICON SOLAR CELL WITH PASSIVATION LAYER TO INDUCE SURFACE INVERSION (71) Applicant: International Business Machines Corporation, Armonk, NY (US)

(72) Inventors: Qing Cao, Yorktown Heights, NY (US); Kangguo Cheng, Schenectady, NY (US); Zhengwen Li, Scarsdale, NY (US); Fei Liu, Yorktown Heights, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/528,517

(22) Filed: Oct. 30, 2014

(65) Prior Publication Data
US 2016/0126405 A1    May 5, 2016

(51) Int. Cl.
*H01L 31/18*    (2006.01)
*H01L 31/0216*    (2014.01)
*H01L 31/062*    (2012.01)
*H01L 31/0224*    (2006.01)

(52) U.S. Cl.
CPC ..... *H01L 31/1868* (2013.01); *H01L 31/02168* (2013.01); *H01L 31/022425* (2013.01); *H01L 31/062* (2013.01)

(58) Field of Classification Search
None
See application file for complete search history.

(56) References Cited

U.S. PATENT DOCUMENTS

| | | | | |
|---|---|---|---|---|
| 4,090,213 A | * | 5/1978 | Maserjian | H01L 31/062 136/255 |
| 4,253,881 A | * | 3/1981 | Hezel | H01L 31/02167 136/255 |
| 4,828,628 A | * | 5/1989 | Hezel | H01L 31/02167 136/255 |
| 5,125,984 A | * | 6/1992 | Kruehler | H01L 31/02168 136/255 |
| 8,492,292 B2 | | 7/2013 | Yokota et al. | |
| 8,614,115 B2 | | 12/2013 | Clevenger et al. | |
| 8,735,212 B2 | | 5/2014 | Krause et al. | |
| 2009/0120490 A1 | | 5/2009 | Huang et al. | |
| 2010/0096013 A1 | | 4/2010 | Park | |

(Continued)

FOREIGN PATENT DOCUMENTS

| | | |
|---|---|---|
| KR | 1020120029142 A | 3/2012 |
| WO | 2013032335 A1 | 3/2013 |

OTHER PUBLICATIONS

Franklin, "Scalable and Fully Self-Aligned n-Type Carbon Nanotube Transistors with Gate-All-Around," IEDM12-84, IEEE, 2012, pp. 4.5.1-4.5.4.

*Primary Examiner* — Bilkis Jahan
(74) *Attorney, Agent, or Firm* — L. Jeffrey Kelly; Louis J. Percello (57) ABSTRACT

The present invention relates generally to a photovoltaic solar cell device and more particularly, to a structure and method of inducing charge inversion in a silicon substrate by using a highly charged passivation layer on an upper side of the silicon substrate. A positively charged passivation layer comprising hafnium oxide may be formed on an insulating layer covering an upper surface of a p-doped silicon substrate and on a metal contact to induce a strong inversion layer in an upper portion of the p-doped silicon substrate.

18 Claims, 6 Drawing Sheets

(56) References Cited

U.S. PATENT DOCUMENTS

| | | | |
|---|---|---|---|
| 2010/0263721 A1* | 10/2010 | Lim | H01L 31/02168 136/256 |
| 2011/0126907 A1* | 6/2011 | Lee | H01L 31/02167 136/261 |
| 2011/0155226 A1 | 6/2011 | Kusunoki et al. | |
| 2012/0273043 A1* | 11/2012 | Lochtefeld | H01L 31/06875 136/261 |
| 2012/0280208 A1 | 11/2012 | Jain | |
| 2013/0186460 A1 | 7/2013 | Chen et al. | |
| 2013/0291936 A1 | 11/2013 | Chen et al. | |
| 2014/0299187 A1* | 10/2014 | Chang | H01L 31/0747 136/258 |

* cited by examiner

MIS-IL SILICON SOLAR CELL WITH PASSIVATION LAYER TO INDUCE SURFACE INVERSION

BACKGROUND

The present invention relates generally to a solar cell device and more particularly, to a structure and method of inducing charge inversion in the upper portion of a silicon substrate.

Solar cells are devices that convert light energy into electrical energy by the photovoltaic effect. More specifically, solar cells include a semiconductor material that absorbs photons from light. When the photons are absorbed, valance band electrons present in the semiconductor material become excited, jump to the conduction band, and become free. The free electrons then diffuse through the semiconductor material. Some of the free electrons may reach a junction where they are accelerated into a different material, typically a metal contact, by a built-in potential. This movement generates an electromotive force, thus converting some of the light energy into electric energy.

SUMMARY

According to an embodiment, a method of forming a metal-insulator-semiconductor inversion layer (MIS-IL) solar cell is disclosed. The method may include: forming a positively charged passivation layer on an insulating layer and on a metal contact to induce a strong inversion layer in an upper portion of a substrate, wherein the insulating layer is formed on an upper surface of the substrate and the metal contact is formed on the insulating layer.

According to another embodiment, a method is disclosed. The method may include: forming a metal layer on a bottom surface of a substrate; annealing the substrate and the metal layer to form a p+ doped layer in a bottom portion of the substrate; forming an insulating layer on an upper surface of the substrate; forming a metal contact on the insulating layer; forming a positively charged passivation layer on the insulating layer and on the metal contact to induce a strong inversion layer in an upper portion of a substrate; and forming an anti-reflective (AR) layer on the positively charged passivation layer.

According to another embodiment, a MIS-IL solar cell structure is disclosed. The structure may include: a metal layer on a bottom surface of a substrate; a p+ doped layer in a bottom portion of the substrate; an insulating layer on an upper surface of the substrate; a metal contact on the insulating layer; a positively charged passivation layer on the insulating layer and on the metal contact; an inversion layer in an upper portion of a substrate; and an anti-reflective (AR) layer on the positively charged passivation layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to a photovoltaic solar cell device and more particularly, to a structure and method of inducing charge inversion in a silicon substrate by using a highly charged passivation layer on an upper side of the silicon substrate.

One semiconductor material typically used for manufacturing solar cells is silicon. In solar cells, silicon can be used either as mono or polycrystalline silicon. In silicon solar cells, the collection junction is typically a n+/p junction. The n+ layer is usually created by diffusing electron-donor elements, such as phosphorus atoms, into the top side of a lightly p-doped absorbing layer using an annealing process. This annealing process may include heating the structure to temperatures greater than 800° C. for an extended period of time, a substantially energy intensive process. In addition, a high standard of wafer and furnace cleaning sequences, along with high-purity processing gases and chemicals, are required to avoid unwanted impurity incorporation during the annealing process, which may cause an increase in electron recombination within the semiconductor material and may negatively affect cell efficiency.

Alternatively, the n+/p junction can be replaced with a metal/Si Schottky junction, eliminating the need to form the n+ layer along with the associated fabrication costs. However, there are performance limitations associated with a metal/Si Schottky junction, primarily the lack of transparency of the metal and the problem of Fermi level pinning. Fermi level pinning occurs when the chemical termination of the silicon substrate against the metal contact creates electron states within the band gap of the silicon material. These metal-induced gap states, and their occupation by electrons, tend to pin the center of the band gap to the Fermi level, thereby effectively reducing the height of the Schottky barrier. As a consequence of Fermi level pinning, it may be difficult to form ohmic contacts. Non-ohmic contacts present a parasitic resistance to current flow that consumes energy and lowers device performance.

A metal-insulator-semiconductor inversion layer ("MIS-IL") solar cell may be used to counteract the Fermi level pinning by introducing an intermediate insulating layer between the metal and the silicon so the two surfaces do not directly interact to cause the pinning. In addition, an inversion layer may be induced below an upper surface of the unmetallized silicon to increase the surface conductance. The inversion layer may be induced by forming a positively charged SiN layer on the insulating layer. Thin metal finger contacts may be formed on the insulating layer to ensure there is enough surface area of the SiN layer available for light absorption.

The quantity of positive charges in the SiN layer available to induce the inversion layer is very important for device performance. The positive charge density is very dependent on the quality and stability of the SiN layer, which may be difficult to control during fabrication. In addition, the processing temperatures required to form the SiN layer, approximately 400° C. to approximately 500° C., may cause damage to the metal contacts, particularly those composed of Al.

A method of forming a strong inversion layer in a MIS-IL solar cell using a positively charged passivation layer, separate and distinct from the SiN layer, to better control positive charge density is described below with reference to FIGS. 1-6.

Figure 1:
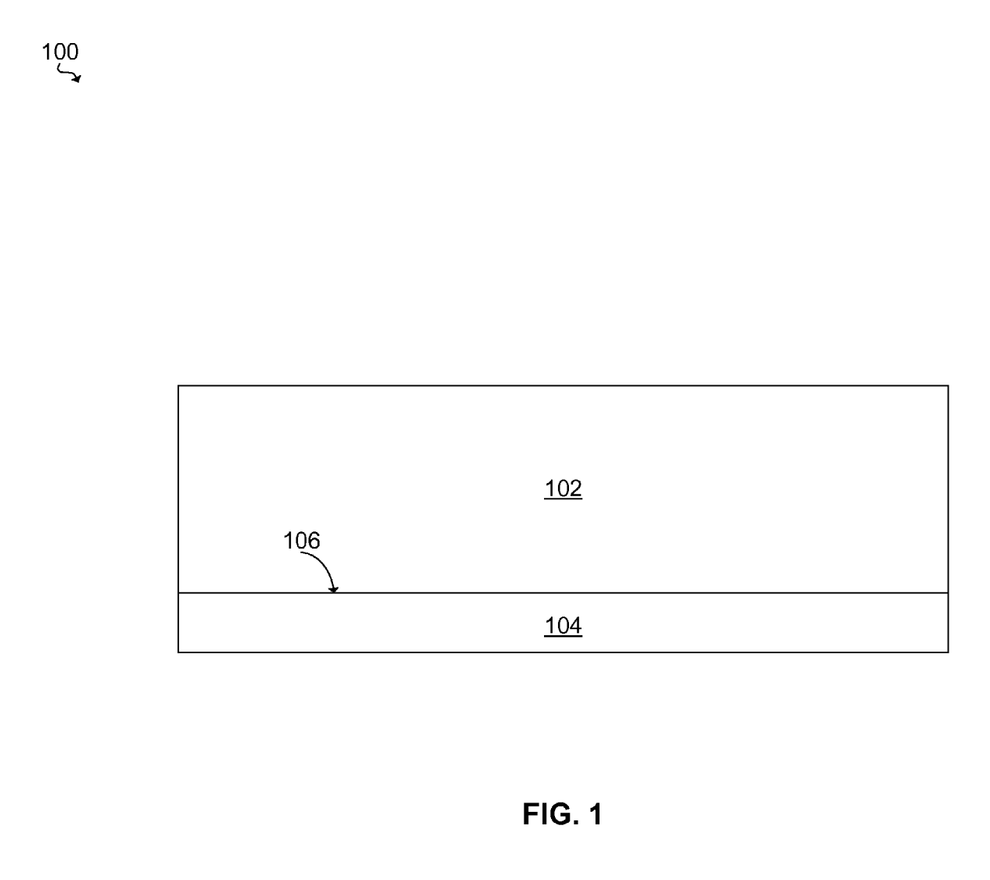
FIG. 1 is a cross section view illustrating a semiconductor structure including a substrate and a metal layer, according an embodiment of the present invention.

Referring now to FIG. 1, a cross section view a structure 100 is shown. The structure 100 may include a substrate 102. The substrate 102 may include any known bulk semiconductor or layered semiconductor such as Si/SiGe, a silicon-on-insulator (SOI), or a SiGe-on-insulator (SGOI). Examples of bulk semiconductor substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. In a preferred embodiment, the substrate 102 may be composed of p-doped silicon.

A metal layer 104 may be formed on a bottom surface 106 of the substrate 102. In an embodiment, the metal layer 104 may be composed of a conductive metal, such as, for example Cu, Ag, Au, W, or alloys thereof. In a preferred embodiment, the metal layer 104 may be composed of Al or an Al alloy. The metal layer 104 may be formed using any conventional deposition technique known in the art, such as, for example, atomic layer deposition (ALD), chemical vapor deposition (CVD), low pressure CVD (LPCVD), physical vapor deposition (PVD), molecular beam deposition (MBD), pulsed laser deposition (PLD), liquid source misted chemical deposition (LSMCD), or sputtering. The metal layer 104 may serve as an electrical contact to the bottom surface 106 of the substrate 102.

Figure 2:
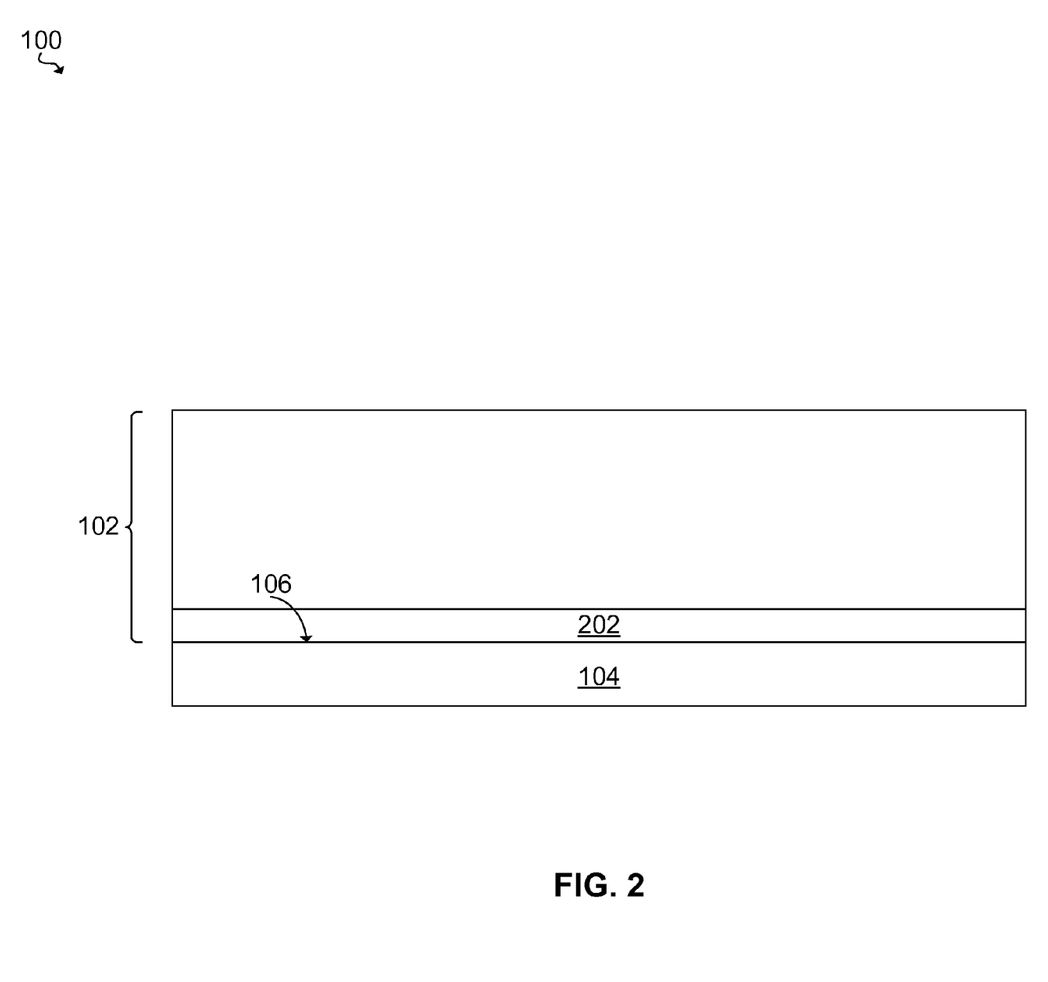
FIG. 2 is a cross section view illustrating annealing the substrate and the metal layer to form a p+ layer in the substrate, according an embodiment of the present invention.

Referring now to FIG. 2, a cross section view illustrating annealing the substrate 102 and the metal layer 104 to form a p+ layer 202 in a bottom portion of the substrate 102 is shown. The p+ layer 202 may serve as an ohmic contact between the rear surface 106 of the substrate 102 and the metal layer 104. The p+ layer 202 may be formed using a conventional annealing technique, such as, for example, rapid thermal annealing (RTA). In an embodiment, the annealing process may include heating the substrate 102 and the metal layer 104 to a temperature ranging from approximately 400° C. to approximately 600° C. for a time ranging from approximately 5 min to approximately 15 min in the presence of $N_2$.

Figure 3:
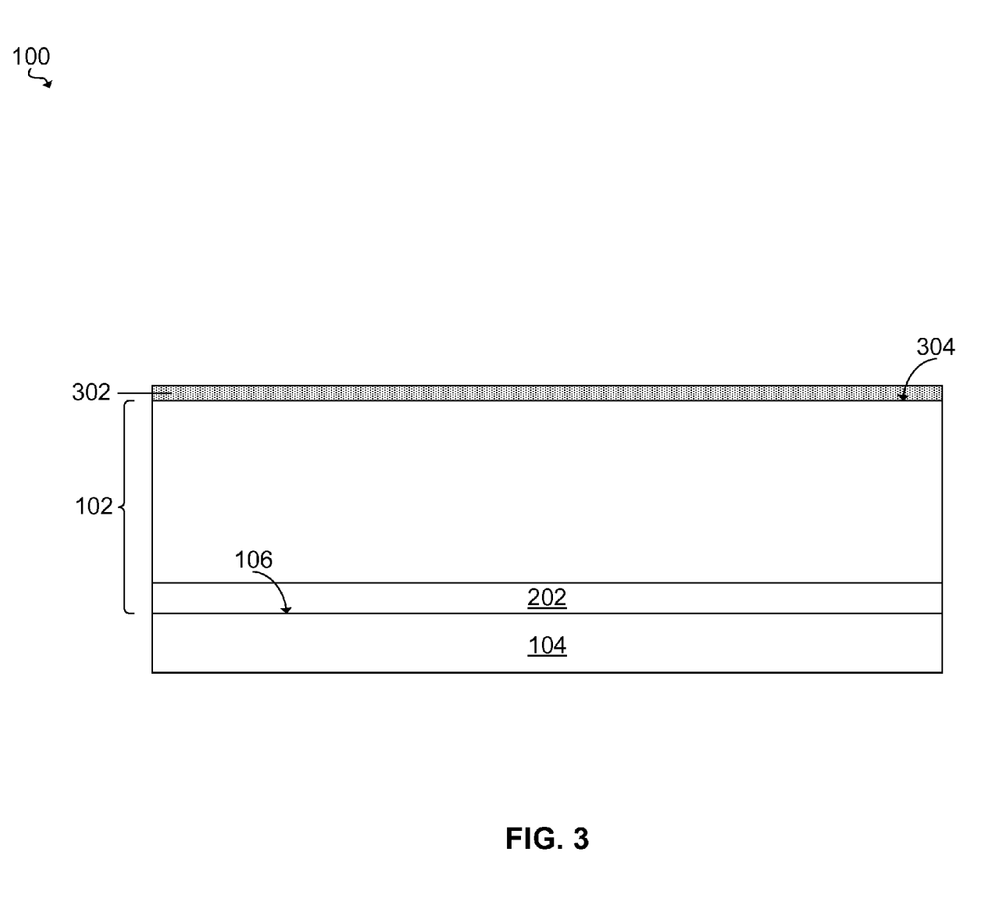
FIG. 3 is a cross section view illustrating forming an insulating layer on an upper surface of the substrate, according an embodiment of the present invention.

Referring now to FIG. 3, a cross section view illustrating forming an insulating layer 302 on an upper surface 304 of the substrate 102 is shown. In an embodiment, the insulating layer 302 may be composed of a dielectric material such as, for example, an oxide, a nitride, or an oxynitride. In an embodiment, the insulating layer 302 may be composed of silicon oxide. The insulating layer may be formed using any conventional deposition technique known in the art, such as, for example, ALD, CVD, LPCVD, PVD, MBD, PLD, LSMCD, sputtering, or spin-on deposition. In an embodiment, the insulating layer 302 may have a thickness ranging from approximately 0.5 nm to approximately 1.5 nm.

Figure 4:
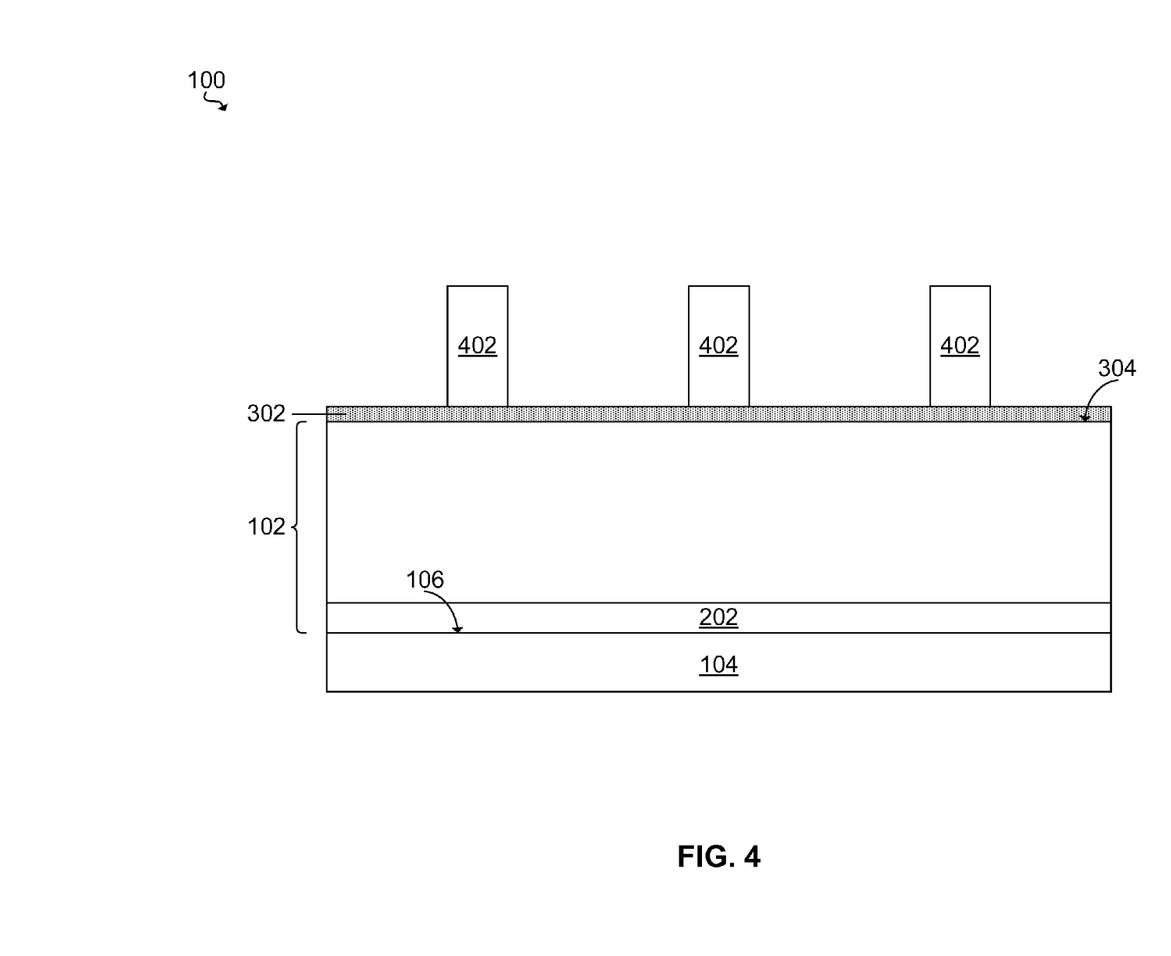
FIG. 4 is a cross section view illustrating forming one or more contacts on the insulating layer, according an embodiment of the present invention.

Referring now to FIG. 4, a cross section view illustrating forming one or more contacts 402 (hereinafter "contacts") on the insulating layer 302 is shown. The contacts 402 may be composed of a conductive metal, such as, for example Cu, Ag, Au, W, or alloys thereof. In a preferred embodiment, the contacts 402 may be composed of Al or an alloy thereof. The contacts 402 may be formed using any conventional deposition technique known in the art, such as, for example, ALD, CVD, LPCVD, PVD, MBD, PLD, LSMCD, or sputtering. In a preferred embodiment, the contacts 402 may be formed using a screen printing process.

Figure 5:
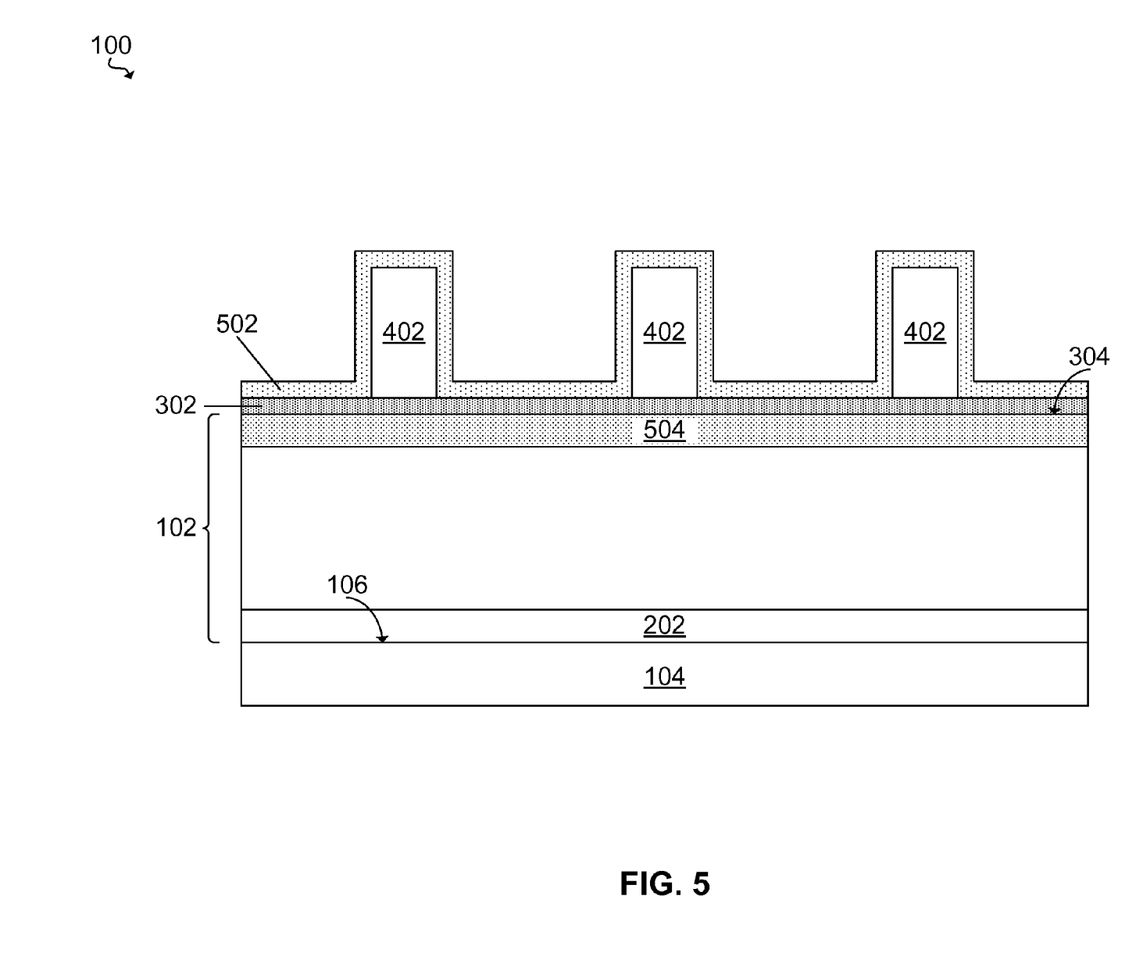
FIG. 5 is a cross section view illustrating forming a positively charged passivation layer on the insulating layer and the contacts, according an embodiment of the present invention.

Referring now to FIG. 5, a cross section view illustrating forming a passivation layer 502 on the insulating layer 302 and the contacts 402 is shown. The passivation layer 502 may be composed of a metal oxide having a positive charge. In an embodiment, the passivation layer 502 may be composed of an oxide containing a lanthanide, such as, for example, lanthanum oxide. In another embodiment, the passivation layer 502 may be composed of an oxide containing a transition metal, such as, for example, hafnium oxide. The passivation layer 502 may be formed using any conventional deposition technique known in the art, such as, for example, CVD, LPCVD, PVD, MBD, PLD, LSMCD, or sputtering. In a preferred embodiment, the passivation layer 502 may be formed using ALD. The passivation layer 502 may have a thickness ranging from approximately 0.1 nm to approximately 5 nm. In a preferred embodiment, the passivation layer 502 may have a thickness ranging from approximately 1 nm to approximately 2 nm.

The positively charge of the passivation layer 502 may induce the formation of an inversion layer 504 in an upper portion of the semiconductor substrate 102. The inversion layer 504 may be a n-type region having a larger electron concentration than the rest of the substrate 102, which may be composed of a p-type material having a larger hole concentration. The inversion layer 504 may have a negative charge. The inversion layer 504 may provide electrons that can be exited and converted to free electrons during the photovoltaic effect upon the absorption of photons through the front surface 304. These free electrons may then travel to the contacts 402, resulting in the generation of an electromotive force.

The charge density in the passivation layer 502 may be tuned, depending on desired applications, by adjusting parameters of the ALD deposition process. Parameters such as deposition temperature and duration can alter the thickness and charge density of the passivation layer 502, which may, in turn, effect the depth, thickness, and charge density of the inversion layer 504. The passivation layer 502 may allow for finer tuning of charge density and depth of the inversion layer 504 than conventional SiN layers, and may be more compatible with Al contacts 402.

Figure 6:
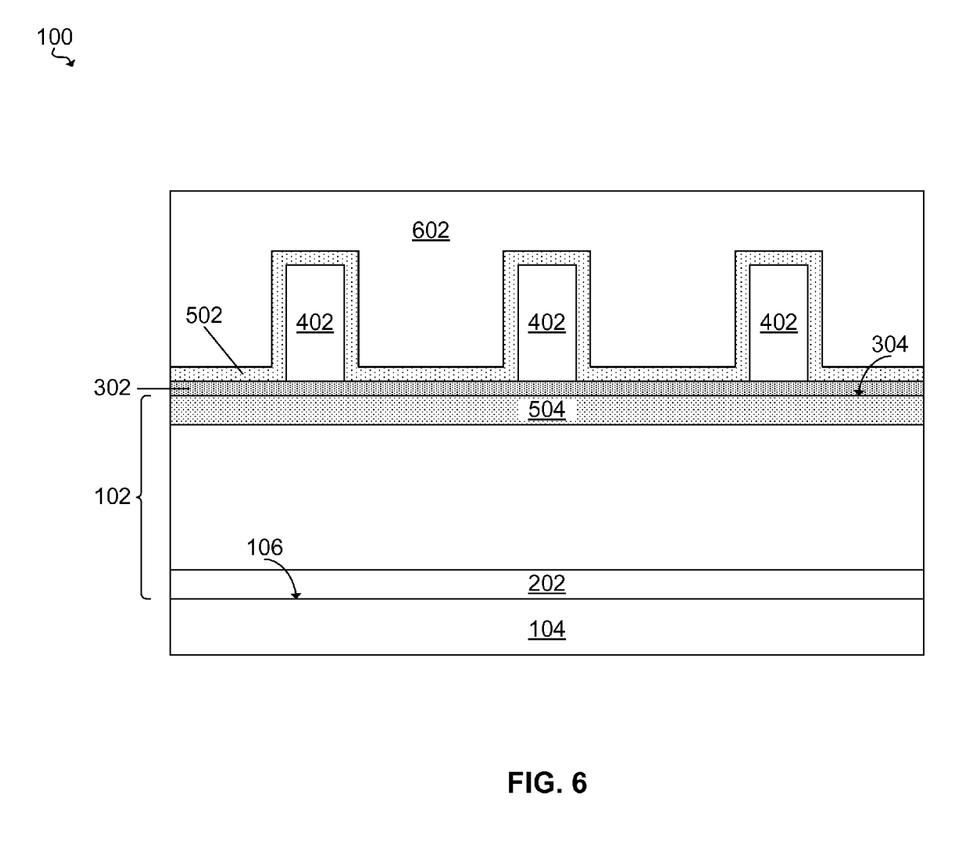
FIG. 6 is a cross section view illustrating forming an anti-reflective layer on the passivation layer, according an embodiment of the present invention.

Referring now to FIG. 6, a cross section view illustrating forming an anti-reflective (AR) layer 602 on the passivation layer 502 is shown. The AR layer 602 may be composed of a dielectric material, such as, for example, silicon nitride. The AR layer 602 may be formed using any conventional deposition technique known in the art, such as, for example, ALD, CVD, LPCVD, PVD, MBD, PLD, LSMCD, sputtering, or spin-on deposition. The AR layer 602 may allow only select wavelengths of light to be absorbed, which, depending on the application, may optimize the photovoltaic effect and generation of free electrons.

Embodiments of the present invention allow for the formation of a strong inversion layer on the front side of a solar using a highly charged positive passivation layer deposited on an insulating layer. The use of a highly charged passivation layer, separate from the SiN layer, to induce the inversion layer may increase the quantity of positive charges available, which is very important for device performance, without the processing challenges and compatibility issues with Al contacts associated with using the SiN layer as a passivation layer. In addition, the ALD process used to form the highly charged passivation layer may allow for better tuning of charge density in both the passivation layer and the inversion layer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming an insulating layer on an upper surface of a substrate;
    forming a metal contact on the insulating layer, the insulating layer separates the metal contact from the substrate;
    conformally forming a positively charged metal oxide layer on an upper surface of the insulating layer and covering the metal contact, the positive charge of the positively charged metal oxide layer causes an n-type region to form in an upper portion of the substrate; and
    forming a silicon nitride layer directly above the positively charged metal oxide layer.

2. The method of claim 1, further comprising:
    tuning the thickness and charge density of the positively charged metal oxide layer to affect the depth and charge density of the n-type region formed in the upper portion of the substrate.

3. The method of claim 2, wherein tuning the thickness and charge density of the positively charged metal oxide layer comprises:
    adjusting a deposition temperature and a duration of an atomic layer deposition process used to form the positively charged metal oxide layer.

4. The method of claim 1, further comprising:
    forming a metal layer on a bottom surface of the substrate; and
    annealing the substrate and the metal layer to form a p+ doped layer in a bottom portion of the substrate.

5. The method of claim 4, wherein forming the metal layer on the bottom surface of the substrate comprising depositing a layer of copper, silver, gold, tungsten, aluminum, or alloys thereof.

6. The method of claim 4, wherein the metal layer on the bottom surface of the substrate comprising copper, silver, gold, tungsten, aluminum, or alloys thereof.

7. The method of claim 1, wherein the substrate comprises a silicon-on-insulator substrate or a silicon germanium-on-insulator substrate.

8. The method of claim 1, wherein the substrate comprises p-doped silicon.

9. The method of claim 1, wherein forming the insulating layer comprises depositing a layer of silicon oxide.

10. The method of claim 1, wherein the insulating layer comprises silicon oxide.

11. The method of claim 1, wherein forming the metal contact comprises using a screen printing process.

12. The method of claim 1, wherein the metal contact comprises copper, silver, gold, tungsten, aluminum, or alloys thereof.

13. The method of claim 1, wherein forming the positively charged metal oxide layer on the insulating layer and on the metal contact comprises depositing a layer of hafnium oxide or lanthanum oxide.

14. The method of claim 1, wherein the positively charged metal oxide layer comprises hafnium oxide or lanthanum oxide.

15. The method of claim 1, wherein the positively charged metal oxide layer has a thickness of approximately 0.1 nm to approximately 5 nm.

16. The method of claim 1, wherein the n-type region in the upper portion of the substrate comprises a larger electron concentration than the remainder of the substrate.

17. The method of claim 1, further comprising:
    forming an anti-reflective (AR) layer on the positively charged metal oxide layer.

18. The method of claim 1, further comprising:
forming a silicon nitride layer on the positively charged metal oxide layer.

\* \* \* \* \*